(12) United States Patent
Hsu et al.

(10) Patent No.: US 12,107,164 B2
(45) Date of Patent: Oct. 1, 2024

(54) SEMICONDUCTOR DEVICE

(71) Applicant: UNITED MICROELECTRONICS CORP., Hsin-Chu (TW)

(72) Inventors: Chia-Jhe Hsu, Kaohsiung (TW); Che-Yi Ho, Chiayi County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 206 days.

(21) Appl. No.: 17/672,733

(22) Filed: Feb. 16, 2022

(65) Prior Publication Data

US 2023/0231051 A1 Jul. 20, 2023

(30) Foreign Application Priority Data

Jan. 19, 2022 (CN) .......................... 202210059312.4

(51) Int. Cl.
*H01L 29/78* (2006.01)
*H01L 21/02* (2006.01)
*H01L 29/08* (2006.01)
*H01L 29/165* (2006.01)

(52) U.S. Cl.
CPC ...... *H01L 29/7848* (2013.01); *H01L 21/0245* (2013.01); *H01L 21/02502* (2013.01); *H01L 21/0251* (2013.01); *H01L 21/02532* (2013.01); *H01L 21/0262* (2013.01); *H01L 21/02639* (2013.01); *H01L 29/0847* (2013.01); *H01L 29/165* (2013.01)

(58) Field of Classification Search
CPC ............. H01L 29/7848; H01L 29/0847; H01L 29/165; H01L 29/785; H01L 29/161; H01L 29/66545; H01L 29/66628; H01L 29/66636; H01L 29/7834; H01L 29/06; H01L 29/0603; H01L 29/0684; H01L 21/0245; H01L 21/02502; H01L 21/0251; H01L 21/02532; H01L 21/0262; H01L 21/02639
See application file for complete search history.

(56) References Cited

U.S. PATENT DOCUMENTS

| | | | |
|---|---|---|---|
| 6,537,370 B1 | 3/2003 | Hernandez et al. | |
| 2015/0236157 A1* | 8/2015 | Kwok | H01L 29/7378 257/192 |
| 2017/0077244 A1* | 3/2017 | Chang | H01L 29/785 |
| 2017/0117410 A1* | 4/2017 | Hu | H01L 29/165 |
| 2021/0376093 A1* | 12/2021 | Chu | H01L 29/0673 |
| 2021/0376129 A1* | 12/2021 | Yang | H01L 29/7851 |

* cited by examiner

*Primary Examiner* — Farun Lu
*Assistant Examiner* — Sandra Milena Rodriguez Villan
(74) *Attorney, Agent, or Firm* — Winston Hsu

(57) ABSTRACT

A semiconductor device includes a gate structure on a substrate and an epitaxial layer adjacent to the gate structure, in which the epitaxial layer includes a first buffer layer, a second buffer layer on the first buffer layer, a bulk layer on the second buffer layer, a first cap layer on the bulk layer, and a second cap layer on the first cap layer. Preferably, the bottom surface of the first buffer layer includes a linear surface, a bottom surface of the second buffer layer includes a curve, and the second buffer layer includes a linear sidewall.

9 Claims, 2 Drawing Sheets

SEMICONDUCTOR DEVICE

BACKGROUND OF THE INVENTION

1. Field of the Invention

The invention relates to a semiconductor device, and more particularly to a metal-oxide semiconductor (MOS) transistor having epitaxial layer.

2. Description of the Prior Art

In order to increase the carrier mobility of semiconductor structure, it has been widely used to apply tensile stress or compressive stress to a gate channel. For instance, if a compressive stress were to be applied, it has been common in the conventional art to use selective epitaxial growth (SEG) technique to form epitaxial structure such as silicon germanium (SiGe) epitaxial layer in a silicon substrate. As the lattice constant of the SiGe epitaxial layer is greater than the lattice constant of the silicon substrate thereby producing stress to the channel region of PMOS transistor, the carrier mobility is increased in the channel region and speed of MOS transistor is improved accordingly. Conversely, silicon carbide (SiC) epitaxial layer could be formed in silicon substrate to produce tensile stress for gate channel of NMOS transistor.

However, epitaxial layers serving as primary stress-inducing structure in non-planar metal-oxide semiconductor (MOS) transistors, such as fin field effect transistors (Fin-FET) today are difficult to obtain an even surface through the fabrication process, thereby affecting the performance of the device. Hence, how to improve the current fabrication to resolve this issue has become an important task in this field.

SUMMARY OF THE INVENTION

According to an embodiment of the present invention, a semiconductor device includes a gate structure on a substrate and an epitaxial layer adjacent to the gate structure, in which the epitaxial layer includes a first buffer layer, a second buffer layer on the first buffer layer, a bulk layer on the second buffer layer, a first cap layer on the bulk layer, and a second cap layer on the first cap layer. Preferably, the bottom surface of the first buffer layer includes a linear surface, a bottom surface of the second buffer layer includes a curve, and the second buffer layer includes a linear sidewall.

According to another aspect of the present invention, a semiconductor device includes a gate structure on a substrate and an epitaxial layer adjacent to the gate structure. Preferably, the epitaxial layer includes a first buffer layer and a second buffer layer on the first buffer layer, in which the second buffer layer includes a gradient concentration of boron.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
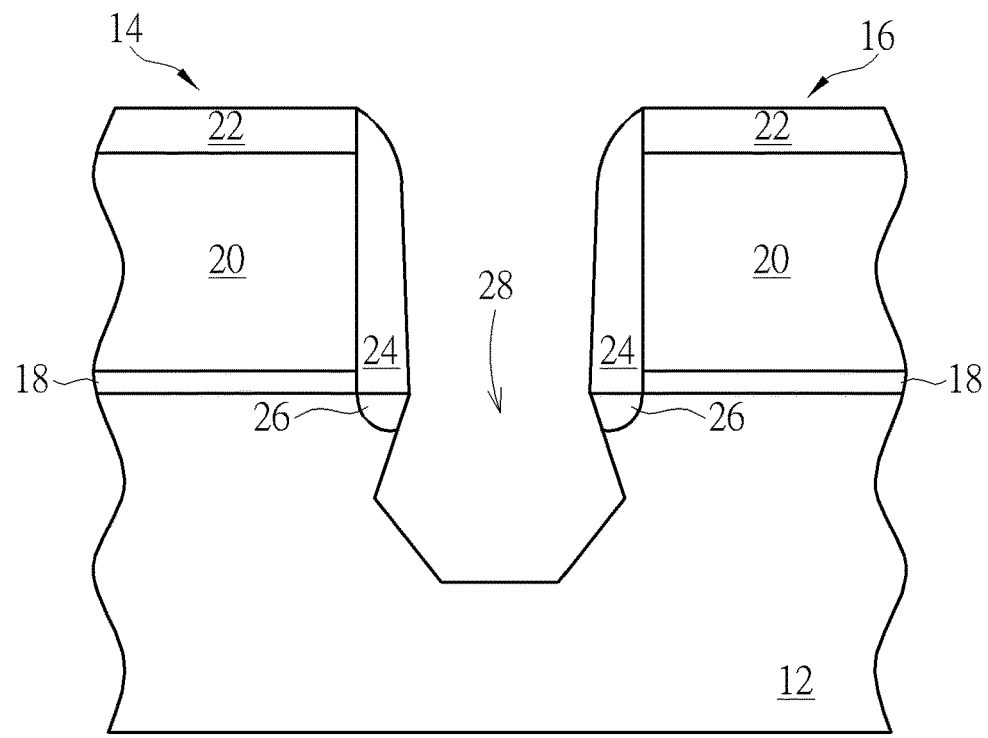
FIGS. 1-4 illustrate a method for fabricating semiconductor device according to an embodiment of the present invention.

Referring to FIGS. 1-4, FIGS. 1-4 illustrate a method for fabricating semiconductor device according to an embodiment of the present invention. As shown in FIG. 1, a substrate 12 is provided and gate structures 14, 16 are formed on the substrate 12. In this embodiment, the formation of the gate structures 14, 16 could be accomplished by sequentially forming a gate dielectric layer, a gate material layer, and a hard mask on the substrate 12, conducting a pattern transfer process by using a patterned resist (not shown) as mask to remove part of the hard mask, part of the gate material layer, and part of the gate dielectric layer through single or multiple etching processes, and then stripping the patterned resist. This forms gate structures 14 and 16 each composed of a patterned gate dielectric layer 18, a patterned gate material layer 20, and a patterned hard mask 22.

It should be noted that even though two gate structures 14, 16 are disclosed in this embodiment, the quantity or number of the gate structures 14, 16 is not limited to two, but could all be adjusted according to the demand of the product. Moreover, only part of the gate structures 14, 16, such as the right portion of the gate structure 14 and left portion of the gate structure 16 are shown in FIG. 1 to emphasize the formation of buffer layer and epitaxial layer between gate structures 14, 16 in later process.

In this embodiment, the substrate 12 could be a semiconductor substrate such as a silicon substrate, an epitaxial substrate, a SiC substrate, or a silicon-on-insulator (SOI) substrate, but not limited thereto. The gate dielectric layer 18 could include $SiO_2$, SiN, or high-k dielectric material; the gate material layer 20 could include metal, polysilicon, or silicide; and the material of hard mask 22 could be selected from the group consisting of $SiO_2$, SiN, SiC, and SiON.

According to an embodiment of the present invention, a plurality of doped wells and/or shallow trench isolations (STIs) could be selectively formed in the substrate 12. Despite the present invention pertains to a planar MOS transistor, it would also be desirable to apply the process of the present invention to non-planar transistors such as Fin-FET devices, and in such instance, the substrate 12 shown in FIG. 1 would become a fin-shaped structure formed atop a substrate 12.

Next, at least one spacer 24 is formed on the sidewalls of the gate structures 14 and 16. Optionally, after a lightly doped ion implantation processes is conducted, a rapid thermal annealing processes is performed at about 930° C. to active the dopants implanted in the substrate 12 for forming lightly doped drains 26 in the substrate 12 adjacent to two sides of the spacer 24. In this embodiment, the spacer 24 could be a single or composite spacer, in which the spacer 24 could further include an offset spacer (not shown) and a main spacer (not shown). The offset spacer and the main spacer are preferably made of different material while the offset spacer and main spacer could all be selected from the group consisting of $SiO_2$, SiN, SiON, and SiCN, but not limited thereto.

Next, a dry etching and/or wet etching process is conducted by using the gate structures 14, 16 and spacers 24 as mask to remove part of the substrate 12 through single or multiple etching processes for forming recesses 28 in the substrate 12 adjacent to two sides of the gate structures 14, 16. Preferably, the etching process could be accomplished by first conducting a dry etching process to form initial recesses (not shown) in the substrate 12 adjacent to two sides of the gate structure 16, and then conducting a wet etching process to expand the recesses isotropically for forming recess 28. According to an embodiment of the present invention, the wet etching process could be accomplished by using etchant including but not limited to for example ammonium hydroxide ($NH_4OH$) or tetramethylammonium hydroxide (TMAH). It should be noted that the formation of the recesses 28 is not limited to the combination of dry etching process and wet etching process addressed previously. Instead, the recesses 28 could also be formed by single or multiple dry etching and/or wet etching processes, which are all within the scope of the present invention. According to an embodiment of the present invention, each of the recesses 28 could have various cross-section shapes, including but not limited to for example a circle, a hexagon, or an octagon. Despite the cross-section of the recess 28 in this embodiment pertains to be a hexagon, it would also be desirable to form the recess 28 with aforementioned shapes, which are all within the scope of the present invention.

Figure 2:
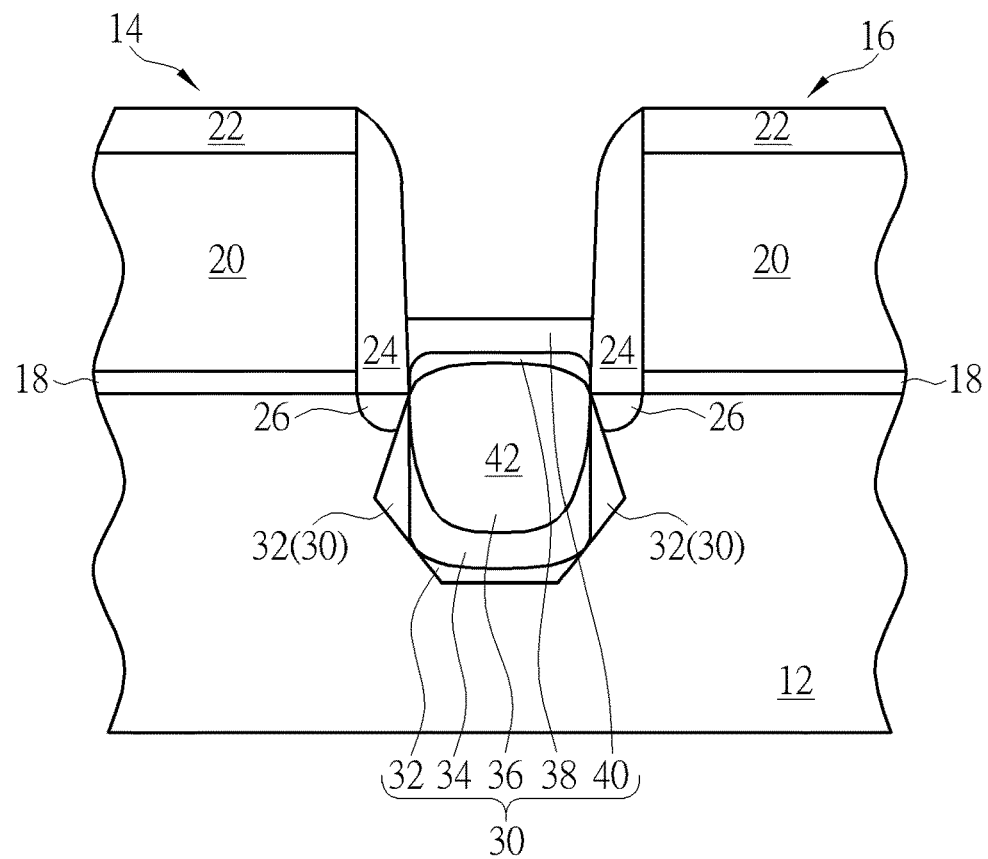

Next, as shown in FIG. 2, a selective epitaxial growth (SEG) is conducted by using gas such as dichlorosilane (DCS) to form an epitaxial layer 30 in each of the recesses 28, in which the epitaxial layer 30 includes a first buffer layer 32 disposed on a surface of the recess 28, a second buffer layer 34 disposed on the first buffer layer 32, a bulk layer 36 disposed on the second buffer layer 34, a first cap layer 38 disposed on the bulk layer 36, and a second cap layer 40 disposed on the first cap layer 38.

In this embodiment, a top surface of the epitaxial layer 30 is slightly higher than the top surface of the substrate 12, in which the epitaxial layer 30 also shares substantially same cross-section shape with the recess 28. For instance, the cross-section of the epitaxial layer 30 could also include a circle, a hexagon, or an octagon depending on the demand of the product. In this embodiment, the epitaxial layer 30 could also be formed to include different material depending on the type of transistor being fabricated. For instance, if the MOS transistor being fabricated were to be a PMOS transistor, the epitaxial layer 30 could be made of material including but not limited to for example SiGe, SiGeB, or SiGeSn. If the MOS transistor being fabricated were to be a NMOS transistor, the epitaxial layer 30 could be made of material including but not limited to for example SiC, SiCP, or SiP. Moreover, the SEG process could also be adjusted to form a single-layered epitaxial structure or multi-layered epitaxial structure, in which heteroatom such as germanium atom or carbon atom of the structure could be formed to have gradient while the surface of the epitaxial layer 30 is preferred to have less or no germanium atom at all to facilitate the formation of silicide afterwards.

Next, an ion implantation process is conducted to form a source/drain region 42 in part or all of the epitaxial layer 30. According to another embodiment of the present invention, the source/drain region 42 could also be formed insituly during the SEG process. For instance, the source/drain region 42 could be formed by implanting p-type dopants during formation of a SiGe epitaxial layer, a SiGeB epitaxial layer, or a SiGeSn epitaxial layer for PMOS transistor, or could be formed by implanting n-type dopants during formation of a SiC epitaxial layer, SiCP epitaxial layer, or SiP epitaxial layer for NMOS transistor. By doing so, it would be desirable to eliminate the need for conducting an extra ion implantation process for forming the source/drain region. Moreover, the dopants within the source/drain region 42 could also be formed with a gradient, which is also within the scope of the present invention.

Viewing from a more detailed perspective, the first buffer layer 32 preferably includes SiGe, a thickness of the first buffer layer 32 is approximately between 60-80 Angstroms or most preferably at 70 Angstroms, and the first buffer layer 32 does not include any dopant or more specifically a un-doped SiGe layer. Preferably, the Ge concentration of the first buffer layer 32 is between 0% to 25%, the Ge concentration of the first buffer layer 32 increases from the substrate 12 toward the second buffer layer 34, or more specifically the Ge concentration of the first buffer layer 32 closer to the substrate 12 underneath is approximately 0% while the Ge concentration of the first buffer layer 32 closer to the second buffer layer 34 above is about 25%.

The second buffer layer 34 preferably includes SiGe, a thickness of the second buffer layer 34 is approximately between 150-170 Angstroms or most preferably at 160 Angstroms, and the second buffer layer 34 preferably includes boron (B) or a boron-doped SiGe layer. Preferably, the thickness of the second buffer layer 34 could be defined as a maximum depth measuring from a top surface of the substrate 12 to a bottommost surface of the second buffer layer 34 extending into the substrate 12. Moreover, the second buffer layer 34 includes a gradient concentration of B atoms, in which the concentration of B atoms preferably increases from the bottommost surface of the second buffer layer 34 upward, or more specifically the B concentration closer to the first buffer layer 32 on the bottom is less than the B concentration closer to the bulk layer 36 on the top. Preferably, the Ge concentration of the second buffer layer 34 is between 25% to 31%, the Ge concentration of the second buffer layer 34 increases from the first buffer layer 32 toward the bulk buffer layer 36, or more specifically the Ge concentration of the second buffer layer 34 closer to the first buffer layer 32 underneath is approximately 25% while the Ge concentration of the second buffer layer 34 closer to the bulk layer 36 above is about 31%.

It should further be noted that the second buffer layer 34 after being implanted with boron through ion implantation process preferably include completely linear or vertical sidewalls perpendicular to the top surface of the substrate 12. In contrast to the bottom surface of the first buffer layer 32 having a planar or linear surface, the bottom surface of the second buffer layer 34 includes a curve or curved surface, the two sidewalls and bottom surface of the second buffer layer 34 preferably divide the first buffer layer 32 into three portions as these three portions do not contact each other directly, and the second buffer layer 34 not only contacts the first buffer layer 32 but also contacts the substrate 12 directly.

The bulk layer 36 preferably includes SiGe, a thickness of the bulk layer 36 is approximately between 110-130 Angstroms or most preferably at 120 Angstroms, and the bulk layer 36 preferably includes boron (B) or a boron-doped SiGe layer. In contrast to the second buffer layer 34 include a gradient concentration of boron atoms, the boron atoms in the bulk layer 36 are distributed evenly or having a non-gradient concentration. In other words, the boron concentration closer to the second buffer layer 34 underneath is substantially the same as the boron concentration closer to the first cap layer 38 on the top while the boron concentration in the bulk layer 36 is greater than or equal to the maximum boron concentration within the second buffer layer 34. In this embodiment, the boron concentration in the bulk layer 36 is approximately $3.0 \times 10^{20}$ atoms/cm$^3$. Moreover, the Ge concentration of the bulk layer 36 is between 30% to 38.5%, the bulk layer 36 includes a gradient concentration of Ge, the Ge concentration of the bulk layer 36 increases from the second buffer layer 34 toward the first cap layer 38, or more specifically the Ge concentration of the bulk layer 36 closer to the second buffer layer 34 underneath is approximately 30% while the Ge concentration of the bulk layer 36 closer to the first cap layer 38 above is about 38.5%. Structurally, the top surface of the bulk layer 36 is slightly higher than the top surface of the substrate 12 on two adjacent sides, the top surface of the bulk layer 36 protruding above the substrate 12 surface includes a curve or curved surface, and sidewalls of the bulk layer 36 could converge with sidewalls of the second buffer layer 34 underneath at a surface of the substrate 12.

The first cap layer 38 preferably includes SiGe and the first cap layer 38 also includes boron (B) or a boron-doped SiGe layer. In contrast to the second buffer layer 34 include a gradient concentration of boron atoms, the boron atoms in the first cap layer 38 are distributed evenly or having a non-gradient concentration. In other words, the boron concentration closer to the bulk layer 36 underneath is substantially the same as the boron concentration closer to the second cap layer 40 on the top while the boron concentration in the first cap layer 38 is less than the boron concentration within the bulk layer 36. In this embodiment, the boron concentration in the first cap layer 38 is approximately $1.0 \times 10^{20}$ atoms/cm$^3$. Moreover, the Ge concentration of the first cap layer 38 is between 38.5% to 0%, the first cap layer 38 includes a gradient concentration of Ge, the Ge concentration of the first cap layer 38 decreases from the bulk layer 38 toward the second cap layer 40, or more specifically the Ge concentration of the first cap layer 38 closer to the bulk layer 36 underneath is approximately 38.5% while the Ge concentration of the first cap layer 38 closer to the second cap layer 40 above is about 0%.

In contrast to the first buffer layer 32, the second buffer layer 34, the bulk layer 36, and the first cap layer 38 all include SiGe, the second cap layer 40 is preferably made of silicon (Si). The second cap layer 40 also includes boron or a boron-doped silicon layer. In contrast to the second buffer layer 34 include a gradient concentration of boron atoms, the boron atoms in the second cap layer 40 are distributed evenly or having a non-gradient concentration. In this embodiment, the boron concentration in the second cap layer 40 is approximately $1.8 \times 10^{21}$ atoms/cm$^3$.

Figure 3:
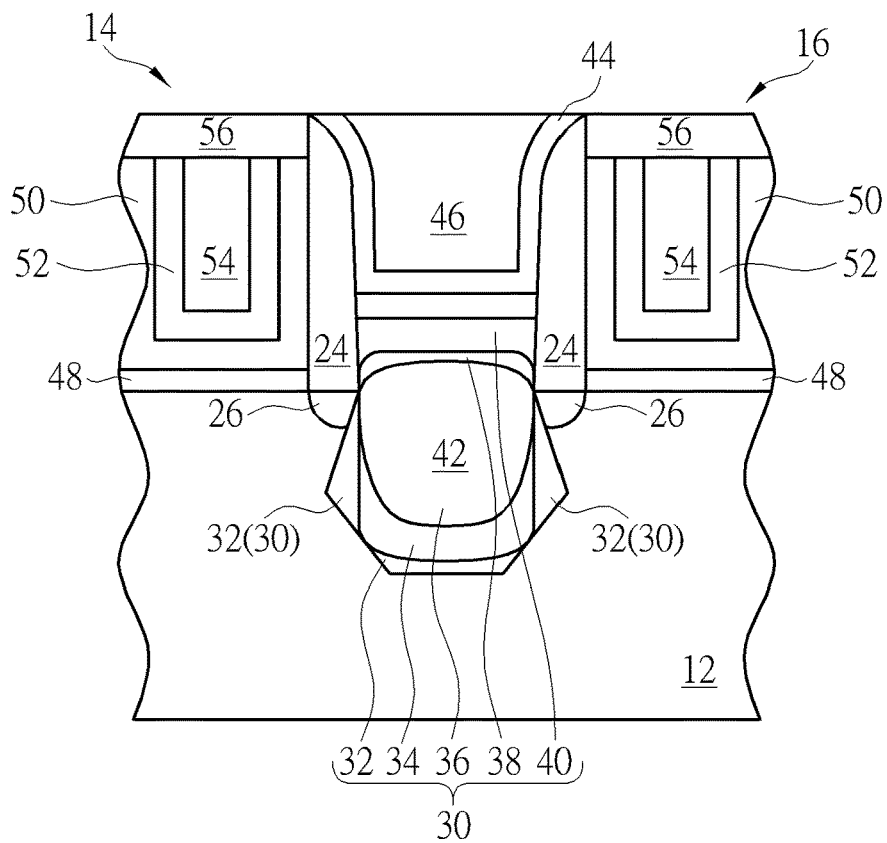

Next, as shown in FIG. 3, a contact etch stop layer (CESL) 44 could be formed on the substrate 12 surface to cover the gate structures 14, 16 and the second cap layer 40, and an interlayer dielectric (ILD) layer 46 is formed on the CESL 44 afterwards. Next, a planarizing process such as a chemical mechanical polishing (CMP) process is conducted to remove part of the ILD layer 46 and part of the CESL 44 so that the top surfaces of the hard mask 22 and ILD layer 46 are coplanar.

Next, a replacement metal gate (RMG) process is conducted to transform the gate structures 14, 16 into metal gates. For instance, the RMG process could be accomplished by first performing a selective dry etching or wet etching process using etchants including but not limited to for example ammonium hydroxide (NH$_4$OH) or tetramethylammonium hydroxide (TMAH) to remove the hard masks 22, the gate material layer 20, and even the gate dielectric layer 18 from gate structures 14, 16 for forming recesses (not shown) in the ILD layer 46. Next, a selective interfacial layer 48 or gate dielectric layer (not shown), a high-k dielectric layer 50, a work function metal layer 52, and a low resistance metal layer 54 are formed in the recesses, and a planarizing process such as CMP is conducted to remove part of low resistance metal layer 54, part of work function metal layer 52, and part of high-k dielectric layer 50 to form metal gates. In this embodiment, each of the gate structures or metal gates fabricated through high-k last process of a gate last process preferably includes an interfacial layer 48 or gate dielectric layer (not shown), a U-shaped high-k dielectric layer 50, a U-shaped work function metal layer 52, and a low resistance metal layer 54.

In this embodiment, the high-k dielectric layer 50 is preferably selected from dielectric materials having dielectric constant (k value) larger than 4. For instance, the high-k dielectric layer 50 may be selected from hafnium oxide (HfO$_2$), hafnium silicon oxide (HfSiO$_4$), hafnium silicon oxynitride (HfSiON), aluminum oxide (Al$_2$O$_3$), lanthanum oxide (La$_2$O$_3$), tantalum oxide (Ta$_2$O$_5$), yttrium oxide (Y$_2$O$_3$), zirconium oxide (ZrO$_2$), strontium titanate oxide (SrTiO$_3$), zirconium silicon oxide (ZrSiO$_4$), hafnium zirconium oxide (HfZrO$_4$), strontium bismuth tantalate (SrBi$_2$Ta$_2$O$_9$, SBT), lead zirconate titanate (PbZr$_x$Ti$_{1-x}$O$_3$, PZT), barium strontium titanate (Ba$_x$Sr$_{1-x}$TiO$_3$, BST) or a combination thereof.

In this embodiment, the work function metal layer 52 is formed for tuning the work function of the metal gate in accordance with the conductivity of the device. For an NMOS transistor, the work function metal layer 52 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 52 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 52 and the low resistance metal layer 54, in which the material of the barrier layer may include titanium (Ti), titanium nitride (TiN), tantalum (Ta) or tantalum nitride (TaN). Furthermore, the material of the low-resistance metal layer 54 may include copper (Cu), aluminum (Al), titanium aluminum (TiAl), cobalt tungsten phosphide (CoWP) or any combination thereof.

Next, part of the high-k dielectric layer 50, part of the work function metal layer 52, and part of the low resistance metal layer 54 are removed to form recesses (not shown), and hard masks 56 are then formed into the recesses so that the top surfaces of the hard masks 56 and ILD layer 46 are coplanar. The hard masks 56 could be made of material including but not limited to for example SiO$_2$, SiN, SiON, SiCN, or combination thereof.

Figure 4:
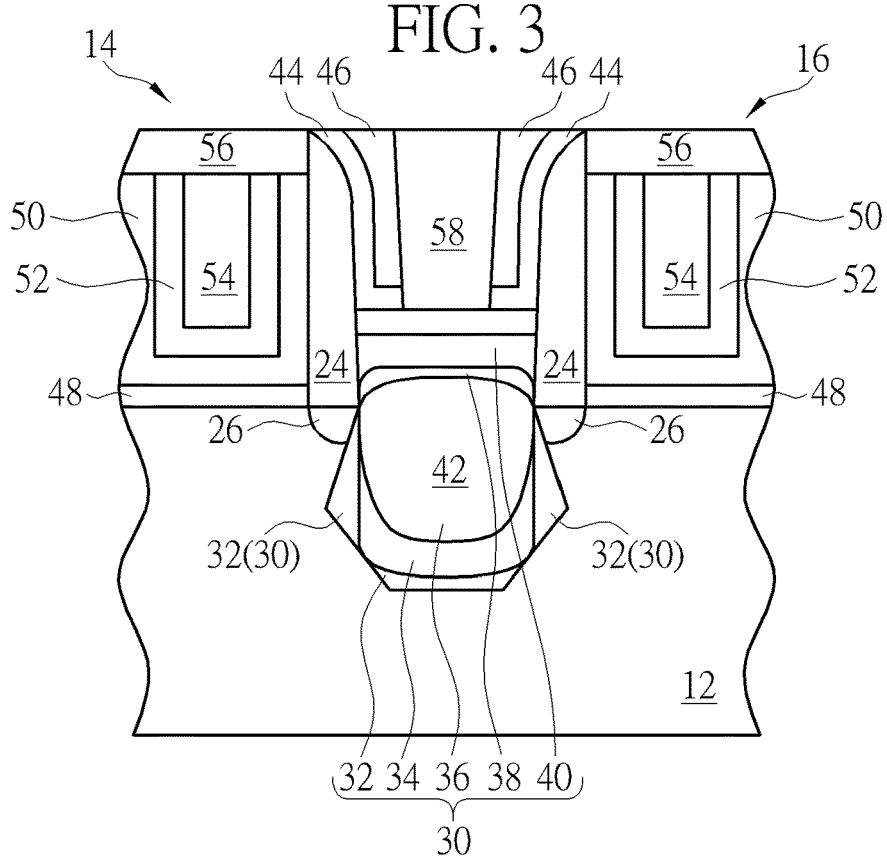

Next, as shown in FIG. 4, a photo-etching process is conducted by using a patterned mask (not shown) as mask to remove part of the ILD layer 46 and part of the CESL 44 adjacent to the gate structures 14, 16 for forming contact holes (not shown) exposing the second cap layer 40 underneath. Next, conductive materials including a barrier layer selected from the group consisting of titanium (Ti), titanium nitride (TiN), tantalum (Ta), and tantalum nitride (TaN) and a metal layer selected from the group consisting of tungsten (W), copper (Cu), aluminum (Al), titanium aluminide (TiAl), and cobalt tungsten phosphide (CoWP) are deposited into the contact holes, and a planarizing process such as CMP is conducted to remove part of aforementioned barrier layer and low resistance metal layer for forming contact plugs 58 electrically connecting the source/drain regions 42. This completes the fabrication of a semiconductor device according to an embodiment of the present invention.

Typically, buffer layer within current epitaxial layer structure does not include any dopant or more specifically an un-doped SiGe layer while the bulk layer atop is a SiGe layer doped with boron. Nevertheless, boron dopants are evenly distributed throughout the bulk layer in current structure such that when boron atoms are diffused to the silicon substrate problem such as film crack would result. To resolve this issue the present invention forms a buffer layer such as the second buffer layer 34 disclosed in the aforementioned embodiment between the buffer layer and the bulk layer as this buffer layer 34 carries a gradient concentration of boron. Preferably, the boron concentration increases from the bottom of the second buffer layer 34 to the top of the second buffer layer 34 or more specifically the boron concentration in the second buffer layer 34 closer to the first buffer layer 32 is less than the boron concentration closer to the bulk layer 36. Structurally, the second buffer layer 34 formed preferably includes vertical and planar sidewalls and a curved bottom surface. By using this approach, the epitaxial layer structure of the present invention is able to provide better strain distribution thereby preventing film crack.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
  a gate structure on a substrate; and
  an epitaxial layer adjacent to the gate structure, wherein the epitaxial layer comprises:
    a first buffer layer; and
    a second buffer layer on the first buffer layer, wherein a bottom surface of the second buffer layer directly contacts the substrate under the first buffer layer, the first buffer layer comprises an un-doped layer, the second buffer layer comprises a doped layer the second buffer layer comprises a gradient concentration of boron, and a concentration of boron increases from a bottom surface of the second buffer layer upward.

2. The semiconductor device of claim 1, further comprising:
  a bulk layer on the second buffer layer;
  a first cap layer on the bulk layer; and
  a second cap layer on the first cap layer.

3. The semiconductor device of claim 2, wherein the bulk layer comprises a gradient concentration of germanium (Ge).

4. The semiconductor device of claim 2, wherein the first cap layer comprises a gradient concentration of germanium (Ge).

5. The semiconductor device of claim 2, wherein the second cap layer comprises silicon.

6. The semiconductor device of claim 1, wherein the first buffer layer comprises an un-doped layer.

7. The semiconductor device of claim 1, wherein the second buffer layer comprises a gradient concentration of germanium (Ge).

8. The semiconductor device of claim 1, wherein a bottom surface of the second buffer layer comprises a curve.

9. The semiconductor device of claim 1, wherein a bottom surface of the first buffer layer comprises a linear surface.

* * * * *